(12) United States Patent
Lai et al.

(10) Patent No.: US 8,525,290 B2
(45) Date of Patent: Sep. 3, 2013

(54) METHOD OF FORMING MEMORY CELL ACCESS DEVICE

(75) Inventors: Erh-Kun Lai, Elmsford, NY (US); Hsiang-Lan Lung, Dobbs Ferry, NY (US); Edward Kiewra, Verbank, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 252 days.

(21) Appl. No.: 13/168,753

(22) Filed: Jun. 24, 2011

(65) Prior Publication Data

US 2012/0326265 A1  Dec. 27, 2012

(51) Int. Cl.
*H01L 21/70* (2006.01)
(52) U.S. Cl.
USPC ............................ 257/506; 438/424; 438/488
(58) Field of Classification Search
USPC .................................. 257/506; 438/424, 488
See application file for complete search history.

(56) References Cited

U.S. PATENT DOCUMENTS

| 5,687,112 A | 11/1997 | Ovshinsky |
| 6,800,504 B2 | 10/2004 | Li et al. |
| 2005/0029502 A1 | 2/2005 | Hudgens |
| 2007/0176251 A1 | 8/2007 | Oh et al. |
| 2009/0316473 A1 | 12/2009 | Happ et al. |

OTHER PUBLICATIONS

J.H. Oh, et al, Full Integration of Highly Manufacturable 512Mb PRAM based on 90nm Technology, IEEE, 1-4244-0439, Aug. 6, 2006, 4 pgs.
G.Servalli, A 45nm Generation Phase Change Memory Technology, 97-4244-5640-6/09/2009, IEEE, 4 pgs.
Gilbert, Nad E., "A macro model of programmable metallization cell devices," Solid-State Electronics v. 49, No. 11, Jan. 2005, pp. 1813-1819.
Sankaran, S. et al. "A 45 nm CMOS node Cu/Low-k/ Ultra Low-k PECVD SiCOH (k=2.4) BEOL Technology," Electron Devices Meeting, 2006. IEDM '06. International , vol., no., pp. 1,4, Dec. 11-13, 2006.
Yamada, Noboru, "Potential of Ge—Sb—Te Phase-change Optical Disks for High-Data-Rate Recording," SPIE V. 3109, Jul. 30, 1997, pp. 28-37.
Yu, Chienfan, et al, "Challenges in 65nm Poly, RX and STI Defect Learning," IEEE SEMI Advanced Semiconductor Manufacturing Conference, May 5-7, 2008, 5 pages.

*Primary Examiner* — Julio J Maldonado
*Assistant Examiner* — Robert Bachner
(74) *Attorney, Agent, or Firm* — Haynes Beffel & Wolfeld LLP

(57) ABSTRACT

A memory device includes an access device including a first doped semiconductor region having a first conductivity type, and a second doped semiconductor region having a second conductivity type opposite the first conductivity type. Both the first and the second doped semiconductor regions are formed in a single-crystalline semiconductor body, and define a p-n junction between them. The first and second doped semiconductor regions are implemented in isolated parallel ridges formed in the single-crystal semiconductor body. Each ridge is crenellated, and the crenellations define semiconductor islands; the first doped semiconductor region occupies a lower portion of the islands and an upper part of the ridge, and the second doped semiconductor region occupies an upper portion of the islands, so that the p-n junctions are defined within the islands.

25 Claims, 11 Drawing Sheets

METHOD OF FORMING MEMORY CELL ACCESS DEVICE

PARTIES TO A RESEARCH AGREEMENT

International Business Machines Corporation, a New York corporation and Macronix International Corporation, Ltd., a Taiwan corporation, are parties to a Joint Research Agreement.

BACKGROUND

1. Field of the Invention

This invention relates to high density memory devices based on phase change based memory materials, including chalcogenide based materials and other programmable resistive materials, and to methods for manufacturing such devices.

2. Description of Related Art

Phase change based memory materials, such as chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state. The magnitude of the current needed for reset can be reduced by reducing the size of the phase change material element in the cell and/or the contact area between electrodes and the phase change material, such that higher current densities are achieved with small absolute current values through the phase change material element.

Because the phase change occurs as a result of heating, a relatively large current is needed in order to heat the phase change material and induce the desired phase change. Field effect transistor access devices have been proposed as drivers for phase change memory cells, but field effect transistors (e.g., MOSFET) can have a weaker current drive. Bipolar junction transistors (BJT) can provide larger current drive than field effect transistors, but the integration of bipolar junction transistors with CMOS peripheral circuitry is difficult and results in highly complex designs and manufacturing processes.

Diode access devices have been proposed as drivers for phase change memory cells. However, diodes having both regions made of doped polysilicon may have an unacceptably high off current. Diodes having both regions made of doped single-crystal silicon may provide a suitably low off current, but processes for making a diode having both regions made of doped single-crystal silicon are complex. Diode structures have been proposed that include polysilicon for one terminal and single-crystal silicon for another. See, U.S. Pat. No. 7,309,921. However, such structures do not completely solve the problem of high off-current due to the polysilicon terminal, and have not been proposed for memory cell access devices. See, U.S. Pat. No. 7,157,314.

It is desirable to provide access devices that reliably provide sufficient current for phase change memory cell programming while having a suitably low off current, that are readily manufacturable at acceptable cost, and that are compatible with high performance logic circuitry.

SUMMARY

In a general aspect a memory device as described herein includes an access device that comprises a pn-junction, including a first doped semiconductor region having a first conductivity type, and a second doped semiconductor region having a second conductivity type opposite the first conductivity type, the first and second doped semiconductors defining a pn-junction therebetween, in which both the first and the second doped semiconductor regions are formed in a single-crystalline semiconductor body. The first and second doped semiconductor regions are implemented in isolated parallel ridges formed in the single-crystal semiconductor body. Each ridge is crenellated, the crenellations defining semiconductor islands; the first doped semiconductor region occupies a lower portion of the islands and an upper part of the ridge, and the second doped semiconductor region occupies an upper portion of the islands, so that the p-n junctions are defined within the islands.

In some embodiments the first doped semiconductor region includes a heavily-doped P-type semiconductor and the second doped semiconductor region includes a heavily-doped N-type semiconductor; in other embodiments the first semiconductor region includes a heavily-doped N-type semiconductor and the second semiconductor region includes a heavily-doped P-type semiconductor.

The single-crystalline semiconductor body may be a bulk semiconductor substrate, such as a semiconductor (for example, silicon) wafer, for example; or an epitaxial silicon layer in a silicon-on-insulator structure.

In another general aspect a memory cell access array includes an access device that comprises a p-n junction, including a first (lower) conductively-doped semiconductor region having a first conductivity type, and a second (upper) conductively-doped semiconductor region having a second conductivity type opposite the first conductivity type, the first and second doped semiconductors defining a pn-junction therebetween, in which the both the first doped semiconductor region and the second doped semiconductor region are formed in a single-crystalline semiconductor body.

In some embodiments the first doped semiconductor region includes a heavily-doped P-type single-crystalline semiconductor (P+) and the second doped semiconductor region includes a heavily-doped N-type single-crystalline semiconductor (N+); in other embodiments the first doped semiconductor region includes a heavily-doped N-type single-crystalline semiconductor (N+) and the second doped semiconductor region includes a heavily-doped P-type single-crystalline semiconductor (P+).

In some embodiments a region having a lower concentration of doping may be situated between the first and second doped regions at the p-n junction, having a conductivity type P– or N– –, for example. This may provide a diode having a smaller leakage current in the off condition, allowing for improved memory operation.

In some embodiments the memory cell access array comprises an array of islands defined between crenellations in a plurality of ridges formed of a single crystalline semiconductor body, the ridges being separated by trenches having a first depth, the crenellations having a second depth less than the first depth, wherein first (lower) conductively-doped semiconductor regions having a first conductivity type occupy lower portions of the islands and upper portions of the ridges between the islands, and wherein second (upper) conductively-doped semiconductor regions having a first conductivity type occupy upper portions of the islands, and wherein p-n junctions are defined within the islands between the first and second doped regions.

The ridges may have a third (deep) doped region of the second conductivity type constituting a well under the first conductively-doped semiconductor region. For example, where the first (lower) doped semiconductor region includes a heavily-doped P-type single-crystalline semiconductor (P+) and the second (lower) doped semiconductor region includes a heavily-doped N-type single-crystalline semiconductor (N+), the third (deep) doped region may comprise a lightly doped N-well; and where the first (lower) doped semiconductor region includes a heavily-doped N-type single-crystalline semiconductor (N+) and the second (upper) doped semiconductor region includes a heavily-doped P-type single-crystalline semiconductor (P+), the third (deep) doped region may comprise a lightly doped P-well.

The deeper trenches defining the ridges may have a depth in a range about 150 nm to about 500 nm, more usually in a range about 250 nm to about 350 nm, in particular examples the ridges have a depth about 300 nm. The crenellations defining the islands may have a depth in a range about 50 nm to about 250 nm less than the depth of the deeper trenches, more usually in a range about 100 nm to about 200 nm less than the depth of the deeper trenches, in particular examples the crenellations have a depth about 150 nm less than the depth of the deeper trenches. The islands may consequently have a height above the height of the ridge between the islands in a range about 20 nm to about 200 nm, more usually in a range about 50 nm to about 150 nm; in particular examples the islands have a height above the ridge between the islands about 100 nm.

The width of the island at the top, as defined by the deeper trenches, may be in a range about 20 nm to about 500 nm, more usually in a range about 50 nm to about 200 nm; the width of the island at the top, as defined by the crenellations, may be in a range about 20 nm to about 200 nm, more usually in a range about 50 nm to about 150 nm; in particular examples the top of the island may have dimensions about 80 nm.

In some embodiments the memory device further includes a memory element electrically coupled with the second doped semiconductor region. The memory element may be a phase change memory element; that is, it may comprise a phase change material.

In another general aspect a memory device array includes first access lines extending in a first direction, and second access lines overlying the first access lines and extending in a second direction, and a plurality of memory cells, each comprising an access device as described herein and a memory material. The access device comprises a p-n junction, including a first (lower) conductively-doped semiconductor region having a first conductivity type, and a second (upper) conductively-doped semiconductor region having a second conductivity type opposite the first conductivity type, the first and second doped semiconductors defining a pn-junction therebetween, in which the both the first doped semiconductor region and the second doped semiconductor region are formed in a single-crystalline semiconductor body. The memory material is in electrical communication with the access devices and with a second access line. In some embodiments the memory material is a phase change memory material. The first conductively-doped semiconductor region may constitute a first access line.

In some embodiments the access device further includes an electrically conductive cap on the second doped semiconductor region; and in some such embodiments the electrically conductive cap includes a silicide. The memory cell may further include a bottom electrode contacting the electrically conductive cap, and in such embodiments the memory material contacts the bottom electrode. The bottom electrode may be omitted in some embodiments, such as embodiments using a pore type memory cell having a pore opening to the cap, filled with programmable resistance material. In other embodiments the memory material contacts the second semiconductor region.

In some embodiments the memory cell further includes a top electrode, and in such embodiments the memory material contacts the top electrode. In some embodiments the top electrode constitutes a second access line.

In another general aspect a method for forming a memory cell access device includes forming crenellated parallel ridges in a single-crystalline semiconductor body, the crenellations defining islands; and doping to define P-N junctions within the islands.

In some aspects the method for forming a memory cell access array includes: providing a single-crystalline semiconductor body having a first conductivity type; forming a layer of a hard mask material over the semiconductor body; forming first trenches in a first direction to a first depth in the semiconductor body, resulting in ridges surmounted by a patterned hard mask; depositing an antireflective coating material to fill the first trenches and to form a thin layer of antireflective coating material over the patterned hard mask; forming second isolation trenches in a direction orthogonal to the first direction to a second depth less than the first depth, resulting in crenellations in the ridges isolating single-crystalline semiconductor islands surmounted by hard mask material; filling the first and second trenches with a dielectric fill and planarizing to expose the hard mask material; removing the hard mask material; performing a first implant of a second conductivity type to a depth less than the first depth; and performing a second implant of the first conductivity type to a depth less than the depth of the first implant.

The single-crystalline semiconductor body may be a bulk semiconductor substrate, such as a semiconductor (for example, silicon) wafer, for example; or an epitaxially-grown single-crystalline semiconductor layer formed over an insulation layer on the wafer ("SOI substrate").

The hard mask material may be a nitride such as a silicon nitride. An oxide layer such as a silicon oxide may be formed over the single-crystalline (e.g., silicon) semiconductor body prior to forming the hard mask material layer.

The first trenches may be formed using reactive ion etch in a shallow trench isolation (STI) procedure; this first STI procedure uses STI processes that are standard in the modern semiconductor industry. Usually the first trenches are formed to a depth in a range about 150 nm to about 500 nm, such as about 300 nm. The width of the ridges at the silicon nitride strips may be in a range about 20 nm to about 500 nm, usually in a range about 50 nm to about 200 nm, and in some embodiments about 200 nm.

The antireflective coating material may be a bottom antireflective coating (BARC) material such as, for example, an organic BARC the antireflective material may be deposited using, for example, a spin-on process.

The second trenches may be formed using reactive ion etch in a shallow trench isolation procedure. In this second STI procedure includes a BARC etch, and the second STI procedure is carried out to a shallower depth than the first STI Procedure. Usually the second trenches are formed to a depth in a range about 70 nm to about 250 nm less than the depth of the first trenches, such as about 150 nm less. The width of the islands between the crenellations at the overlying silicon nitride may be in a range about 20 nm to about 500 nm, usually in a range about 50 nm to about 200 nm, and in some embodiments about 80 nm.

The dielectric fill may be, for example, an oxide, such as HDP oxide or ozone oxide.

In some embodiments the method further includes performing a deep implant having a conductivity type opposite the first conductivity type, forming a lightly-doped well isolating the first and second implants from the bulk semiconductor material. The semiconductor body (or the deep well implant) may for example have a conductivity type N− (N-well), the first implant may for example have a conductivity type P+, and the second implant may have a conductivity type N+.

In some embodiments an implant may result in formation of a depletion region ("intrinsic" region) at the boundary between the region doped by the first implant and the region doped by the second implant. The depletion region may have a conductivity type P−− or N−−, for example.

In another general aspect a method for forming a memory array, by forming an array of memory cell access devices as described above, and forming an array of memory elements electrically connected with the access devices.

In some embodiments the method further includes forming an electrically conductive cap over the surface of the second doped semiconductor region; and in some such embodiments the electrically conductive cap includes a silicide. In some such embodiments the method further includes forming a bottom electrode contacting the electrically conductive cap, and in such embodiments the memory material is formed in contact with the bottom electrode. The bottom electrode may be omitted in some embodiments, such as embodiments using a pore type memory cell having a pore opening to the cap, filled with programmable resistance material. In other embodiments the memory material contacts the second doped semiconductor region.

In some embodiments the memory cell further includes a top electrode, and in such embodiments the memory material contacts the top electrode. In some embodiments the top electrode constitutes a second access line.

BRIEF DESCRIPTION OF THE DRAWINGS

FIG. 2A is a plan view and FIGS. 2B and 2C are sectional views taken at B-B and C-C in FIG. 2A.

FIG. 3A is a plan view and FIGS. 3B and 3C are sectional views taken at B-B and C-C in FIG. 3A.

FIG. 4A is a plan view and FIGS. 4B and 4C are sectional views taken at B-B and C-C in FIG. 4A.

FIG. 5A is a plan view and FIGS. 5B, 5C and 5D are sectional views taken at B-B, C-C and D-D in FIG. 5A.

FIG. 6A is a plan view and FIGS. 6B, 6C and 6D are sectional views taken at B-B, C-C and D-D in FIG. 6A.

FIG. 7A is a plan view and FIGS. 7B, 7C and 7D are sectional views taken at B-B, C-C and D-D in FIG. 7A.

FIG. 8A is a plan view and FIGS. 8B, 8C and 8D are sectional views taken at B-B, C-C and D-D in FIG. 8A.

FIG. 9A is a plan view and FIGS. 9B, 9C and 9D are sectional views taken at B-B, C-C and D-D in FIG. 9A.

DETAILED DESCRIPTION

The invention will now be described in further detail by reference to the drawings, which illustrate alternative specific embodiments and methods. The drawings are diagrammatic, showing features of the embodiments and their relation to other features and structures, and are not made to scale. For improved clarity of presentation, in the figures illustrating various embodiments, elements corresponding to elements shown in other drawings are not all particularly renumbered, although they are all readily identifiable in all the figures. Also for clarity of presentation certain features are not shown in the figures, where not necessary for an understanding of the invention. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows.

Figure 1:
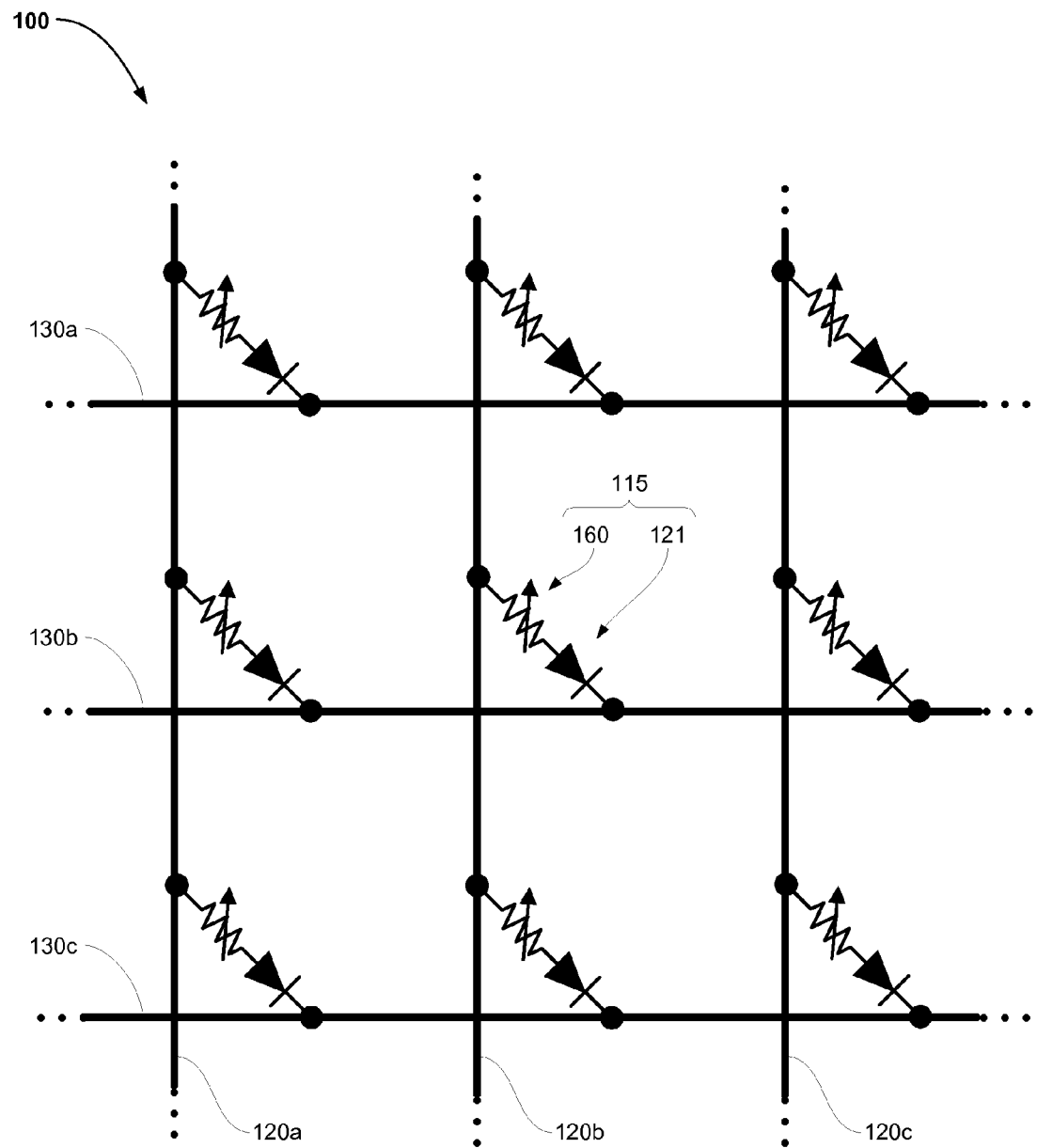
FIG. 1 is a schematic diagram of a memory array employing memory cells having diode access devices as described herein.

FIG. 1 illustrates in a schematic diagram of a portion of a memory array 100 implemented using memory devices and diode access devices as described herein. Each of the memory cells of array 100 includes a diode access device and a memory element (represented in FIG. 1 by a variable resistor) capable of being set to one of a plurality of resistive states and thus capable of storing one or more bits of data.

The array 100 includes a plurality of word lines 130 including word lines 130a, 130b, and 130c extending in parallel in a first direction, and a plurality of bit lines 120 including bit lines 120a, 120b, and 120c extending in parallel in a second direction generally perpendicular to the first direction. The word lines 130 and bit lines 120 are arranged typically in such a manner that a given word line 130 and a given bit line 120 cross over each other but do not physically intersect.

Memory cell 115 is representative of the memory cells of array 100. The memory cell 115 includes a diode access device 121 and a memory element 160 arranged in series; the diode 121 is electrically coupled to the word line 130b and the memory element 160 is electrically coupled to the bit line 120b (or vice-versa).

Reading or writing to memory cell 115 of array 100 can be achieved by applying appropriate voltages and/or currents to the corresponding word line 130b and bit line 120b to induce a current through a selected memory cell 115. The level and duration of the voltages/currents applied is dependent upon the operation performed, e.g., a reading operation or a writing operation.

In a reset (or erase) operation of memory cell 115 having memory element 160 including a phase change material, a reset pulse is applied to the corresponding word line 130b and bit line 120b to cause a transition of an active region of the phase change material into an amorphous phase, thereby setting the phase change material to a resistance within a resistive value range associated with the reset state. The reset pulse is a relatively high energy pulse, sufficient to raise the temperature of at least the active region of the memory element 160 above the melting temperature to place at least the active region in a liquid state. The reset pulse is then quickly terminated, resulting in a relatively quick quenching time as the active region quickly cools to below the transition temperature so that the active region stabilizes to an amorphous phase.

In a set (or program) operation of memory cell 115 having memory element 160 including a phase change material, a program pulse is applied to the corresponding word line 130b and bit line 120b of suitable amplitude and duration to induce a current sufficient to raise the temperature of at least a portion of the active region above the transition temperature and cause a transition of a portion of the active region from the amorphous phase into a crystalline phase, this transition lowering the resistance of the memory element 160 and setting the memory cell 115 to the desired state.

In a read (or sense) operation of the data value stored in memory cell 115 having memory element 160 comprising phase change material, a read pulse is applied to the corresponding word line 130b and bit line 120b of suitable amplitude and duration to induce current to flow that does not result in the memory element 160 undergoing a change in resistive state. The current through the memory cell 115 is dependent upon the resistance of the memory element 160 and thus the data value stored in the memory cell 115.

Figure 2A:
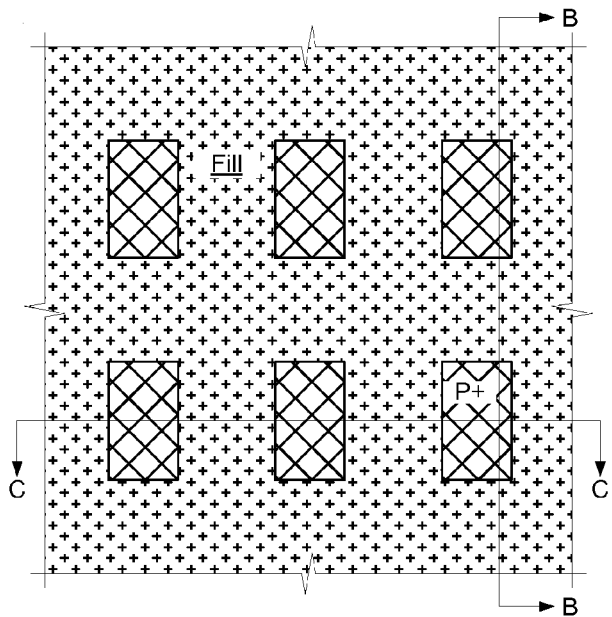
FIGS. 2A, 2B and 2C are diagrammatic sketches showing an embodiment of a portion of a diode access device array as described herein.
Figure 2B:
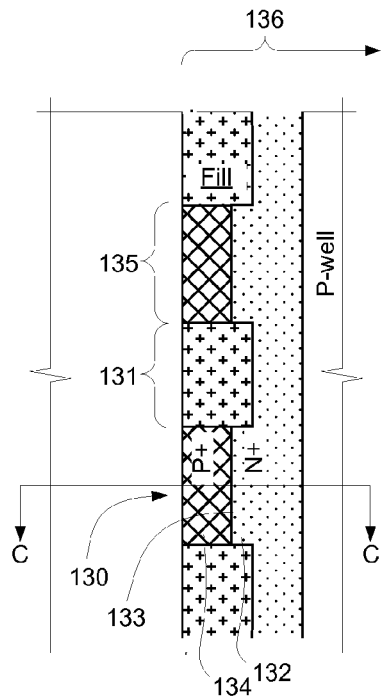
Figure 2C:
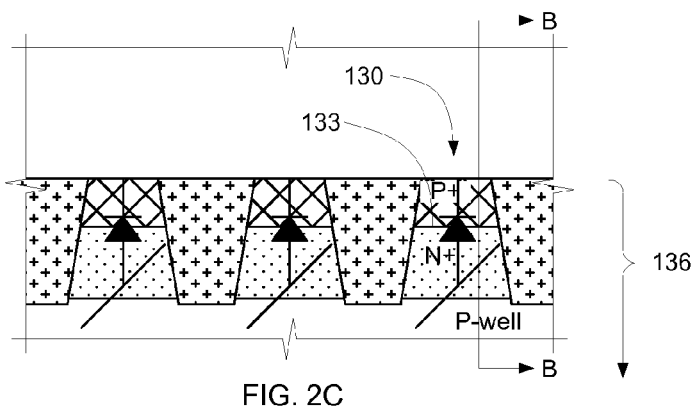

FIGS. 2A, 2B, and 2C show in various views a portion of an embodiment of an array 100 of memory cell access devices 130, which are formed in a single-crystalline semiconductor body. Each memory cell access device 130 includes a pn-junction 133, defined at the boundary between a first doped semiconductor region 132 having a first conductivity type (N+ in this example), and a second doped semiconductor region 134 having a second conductivity type opposite the first conductivity type (P+ in this example). Both the first and the second doped semiconductor regions are formed in a single-crystalline semiconductor body 136. The first and second doped semiconductor regions are implemented in isolated parallel ridges formed in the single-crystal semiconductor body. Each ridge (shown in sectional view in FIG. 2B) is crenellated, the crenellations 131 defining semiconductor islands 135; the first doped semiconductor region 132 occupies a lower portion of the islands and an upper part of the ridge, and the second doped semiconductor region 134 occupies an upper portion of the islands, so that the p-n junctions are defined within the islands.

Figure 10A:
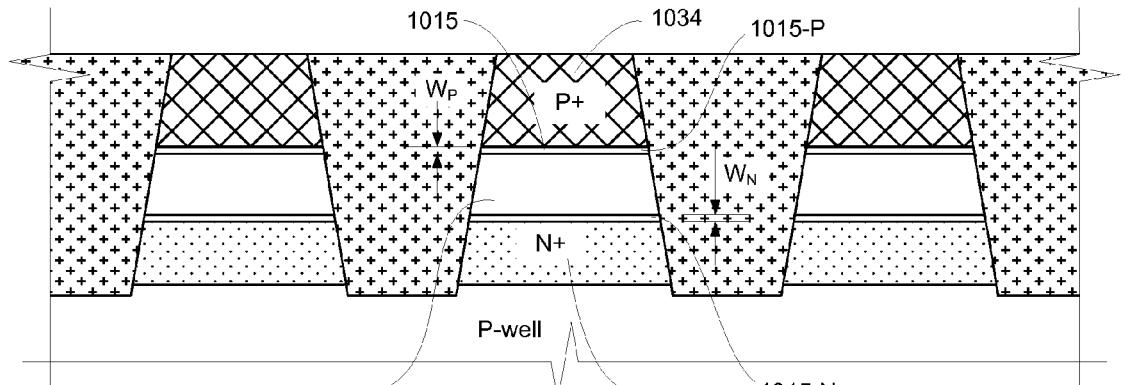
FIG. 10 is a diagrammatic sketch in a sectional view showing an alternative embodiment of an access array as described herein.
Figure 10B:
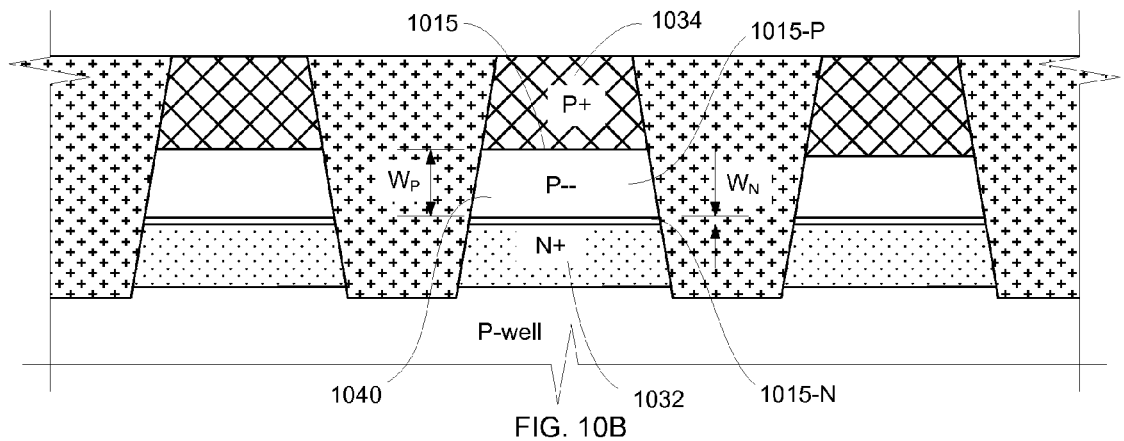
Figure 10C:
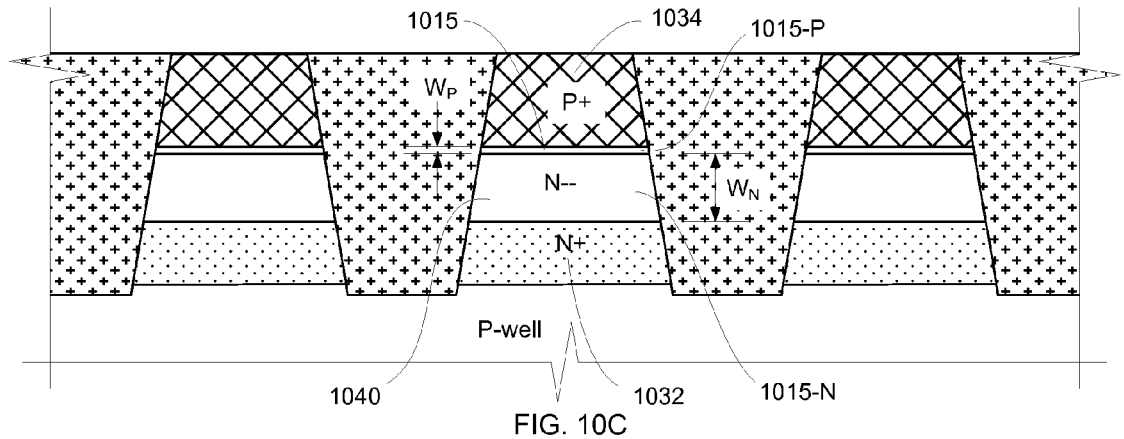

FIGS. 10A, 10B, 10C illustrate in a sectional view as in FIG. 2C, an embodiment of the pn-junction formed as described herein, having a lightly-doped region 1040, where the lightly doped region includes (undoped) intrinsic or lower concentrations of doping (P−− or N−−), located at the p-n junction region. This aspect establishes a diode having smaller leakage current in the off condition and improved breakdown voltage, allowing for improved memory operation. As in the embodiments shown in FIG. 2C, a diode is illustrated including a lower heavily doped N+region 1032, and an upper heavily doped P+ region 1034. A physical boundary 1015 between the lower-doping region and one or the other of the doping regions 1032 and 1034 defines the pn-junction. The width of the junction however is the sum of the widths of depletion regions 1015-N and 1015-P, which have respective widths labeled $W_N$ and $W_P$ in the diagrams (plus the width of the lightly-doped region 1040).

In the example shown in FIG. 10A, the lightly-doped region 1040 is an intrinsic (substantially undoped) region, and depletion regions 1015-N and 1015-P form at the interface of the intrinsic region with both the first and second doped semiconductor regions 1032, 1034. In the example shown in FIG. 10B, the lightly-doped region 1040 is implanted to have a low concentration of doping P−−, resulting in this case in a narrow (width $W_N$) depletion region in the surface of the N+ doping region 1032. In the example shown in FIG. 10C, the lightly-doped region 1040 is implanted to have a low concentration of doping N−−, resulting in this case in a narrow (width $W_P$) depletion region in the surface of the P+ doping region 1034.

Because the depletion region that forms in the islands is isolated from adjacent diodes by crenellations in the ridge, the junctions are isolated from adjacent junctions that can be packed close together.

Figure 3A:
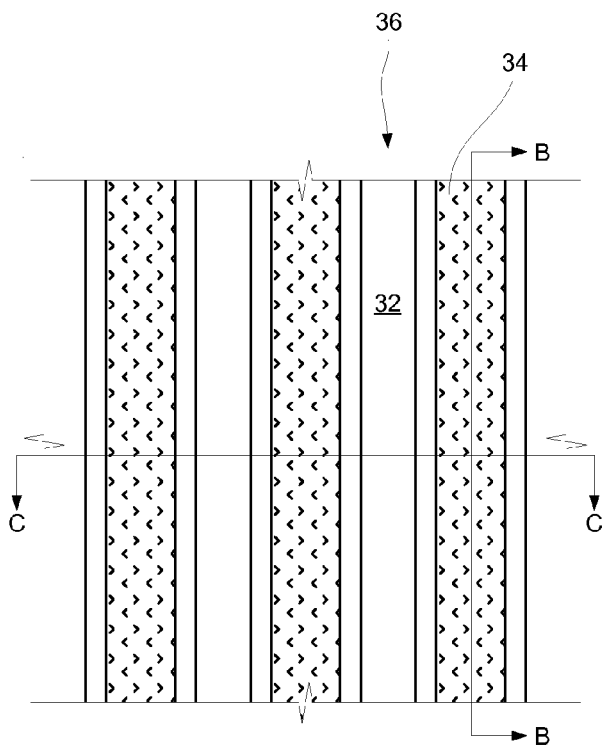
FIGS. 3A, 3B and 3C are diagrammatic sketches showing a stage in a process for making diode access devices such as are shown for example in FIGS. 2A, 2B, 2C.

FIGS. 3A, etc. -9A, etc. illustrate stages in an embodiment of a process for making an access device array as shown for example in FIGS. 2A, 2B, and 2C; and as shown for example in FIGS. 10B, 10B, 10C.

A single-crystalline semiconductor body having a first conductivity type is provided. This may be a bulk semiconductor substrate, such as a semiconductor (for example, silicon) wafer, for example; or an epitaxially-grown single-crystalline semiconductor layer formed over an insulation layer on the wafer ("SOI substrate").

An oxide layer may optionally be formed over the semiconductor body surface; for a silicon semiconductor body the oxide layer may be a silicon oxide, for example.

A layer of a hard mask material is formed over the semiconductor body surface (and over the oxide layer, where present). The hard mask may be, for example, a nitride such as, for a silicon semiconductor body, a silicon nitride.

Figure 3B:
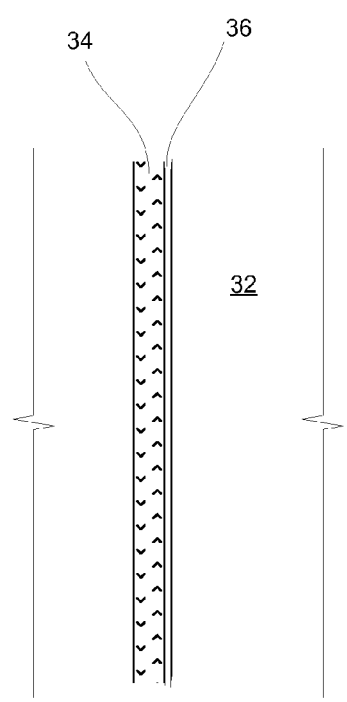
Figure 3C:
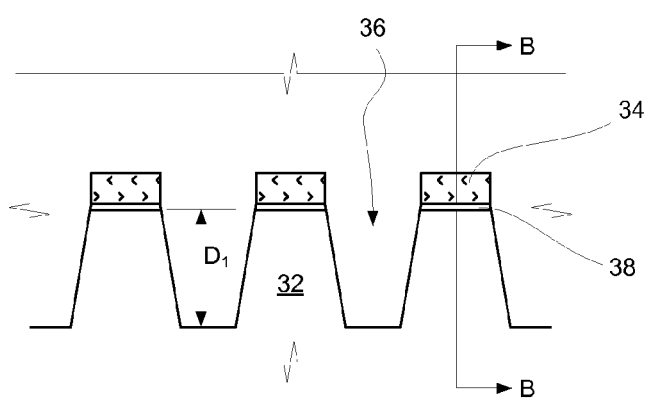

Thereafter first trenches are formed in a first direction to a first depth in the semiconductor body, resulting in ridges surmounted by hard mask material. The first trenches may be formed by a patterned etch procedure, using a patterned photoresist mask (not shown in the FIGS.) and etching (for example by a reactive ion etch) through the hard mask layer, the oxide layer (where present), and the single-crystalline semiconductor body to a determined first trench depth D1. A result is shown in FIGS. 3A, 3B, 3C, in which ridges 32 in the single-crystalline semiconductor body are separated by first trenches 36 having a first trench depth D1; the ridges are surmounted by patterned hard mask material stripes 34, underlain by the optional oxide 38. In the FIGS., the photoresist mask has been removed and damaged layers resulting from the etch procedure have been removed.

Figure 4A:
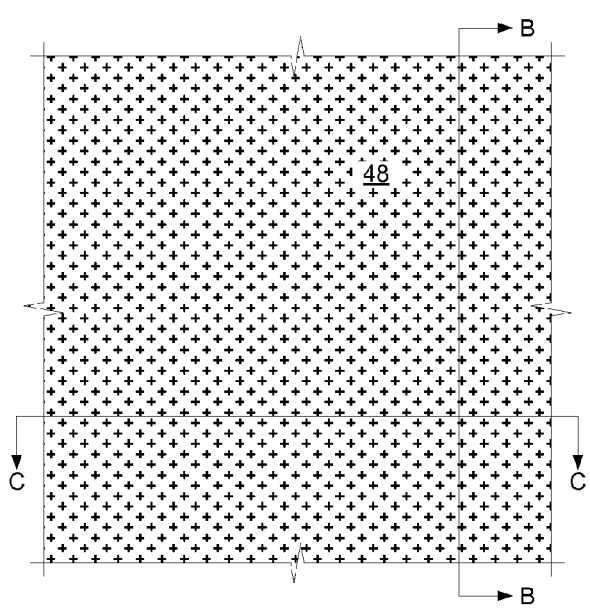
FIGS. 4A, 4B and 4C are diagrammatic sketches showing a stage in a process for making diode access devices such as are shown for example in FIGS. 2A, 2B, 2C.
Figure 4B:
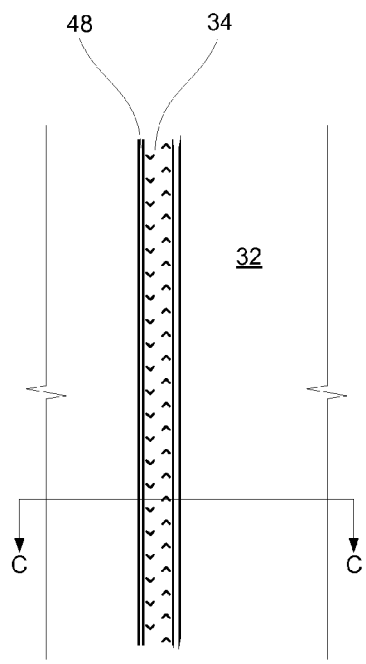
Figure 4C:
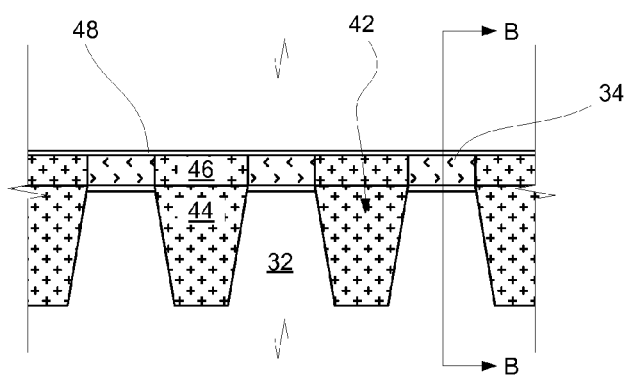
Figure 5D:
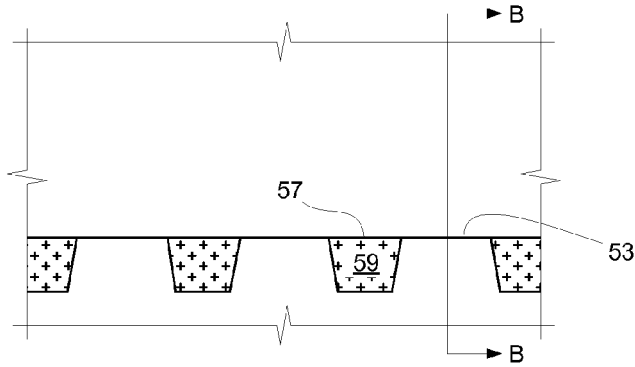
FIGS. 5A, 5B, 5C and 5D are diagrammatic sketches showing a stage in a process for making diode access devices such as are shown for example in FIGS. 2A, 2B, 2C.
Figure 5A:
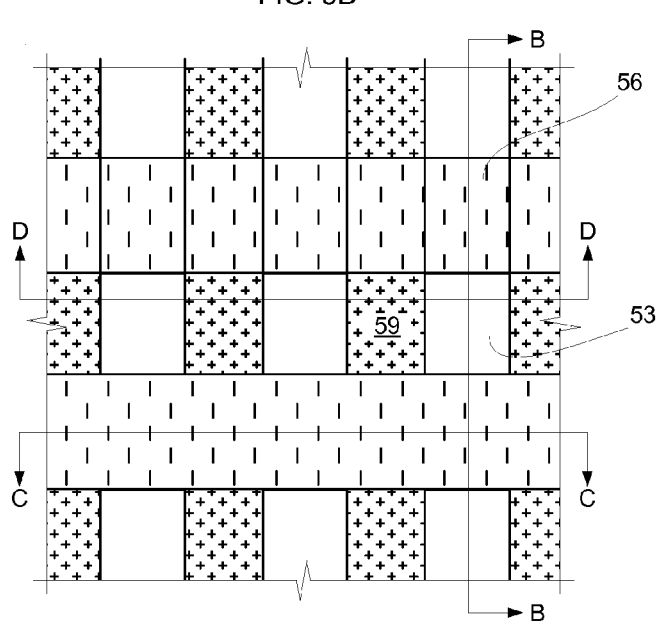
Figure 5B:
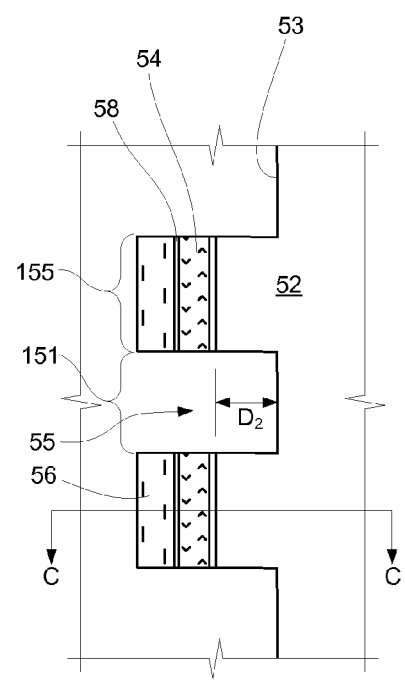
Figure 5C:
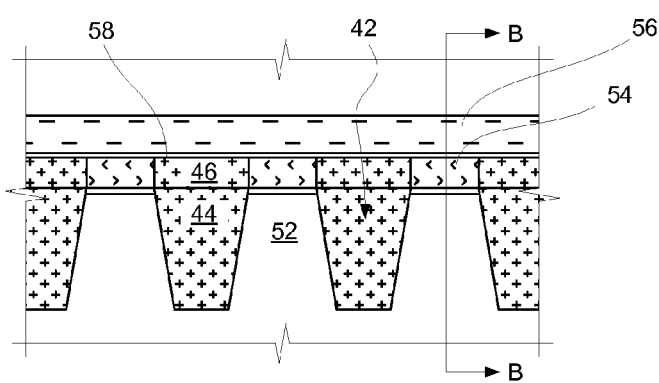
Figure 6D:
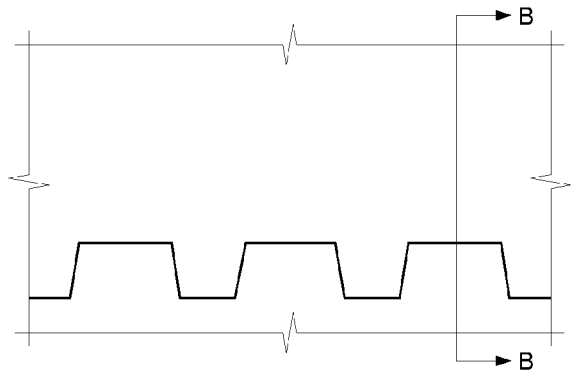
FIGS. 6A, 6B, 6C and 6D are diagrammatic sketches showing a stage in a process for making diode access devices such as are shown for example in FIGS. 2A, 2B, 2C.
Figure 6A:
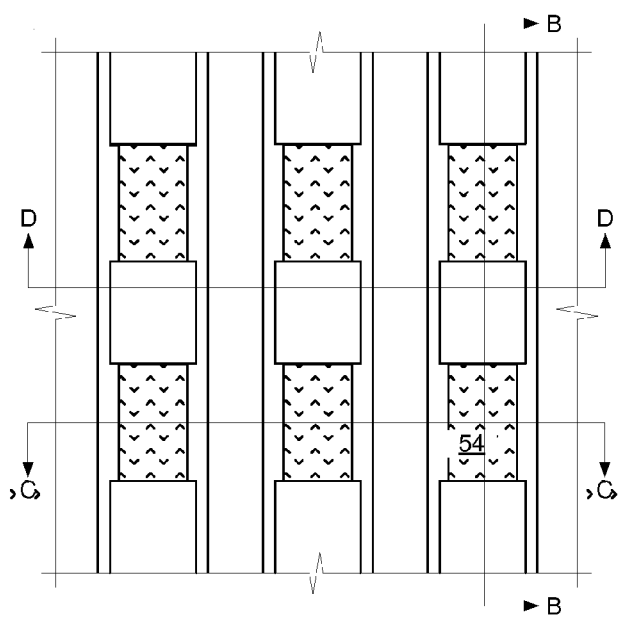
Figure 6B:
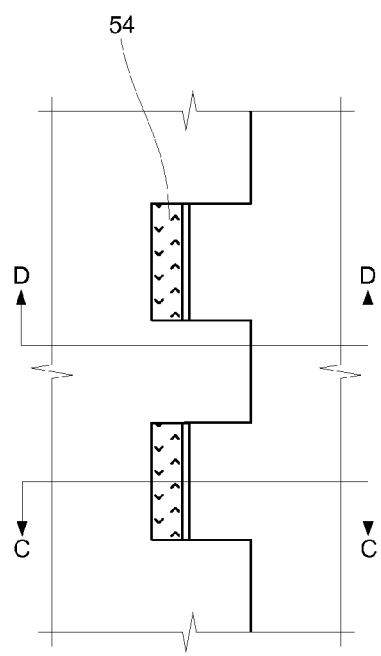
Figure 6C:
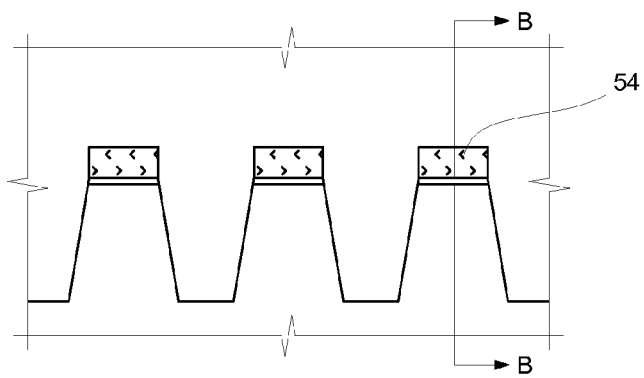

Thereafter an antireflective coating material is deposited to fill the first trenches and to form a thin layer of antireflective coating (ARC) material over the patterned hard mask. A result is shown in FIGS. 4A, 4B, 4C, in which (in this illustration) ARC is deposited in three stages, filling (44) a bottom portion of the trenches 42 and (46) a top portion of the trenches 42, and covering the patterned hard mask over the ridges with a thin ARC material layer 48. It may be preferable to deposit the ARC material in a single spin-on step.

Thereafter second isolation trenches are formed in a direction orthogonal to the direction of the first trenches to a second depth less than the first depth in the semiconductor body, resulting in crenellations in the ridges defining and isolating single-crystalline semiconductor islands surmounted by photoresist and hard mask material. The second trenches may be formed by a patterned etch procedure, using a patterned photoresist mask and etching (for example by reactive ion etch) through the ARC material, the hard mask material stripes, the oxide layer (where present), and the single-crystalline semiconductor ridges to a determined second trench depth D2. A result in shown in FIGS. 5A, 5B, 5C, 5D, in which crenellations 55 formed by the second trenches isolate island structures 155 consisting of single-crystalline islands having a width defined by the photoresist width 155 and a height defined by the depth D2 of the second trenches in the semiconductor material of the ridges 55, surmounted by hard mask material 54, underlain by the optional oxide, covered by the thin layer 58 of ARC material and overlain by the photoresist 56. Because the second trench etch stops at a depth less than the depth of the first trenches, some ARC material remains (59) at the bottom of the first trenches, and a portion 53 of the ridges 52 remains between the islands.

Thereafter the photoresist is stripped and the remaining ARC material is removed, with a result shown in FIGS. 6A, 6B, 6C, 6D.

Figure 7D:
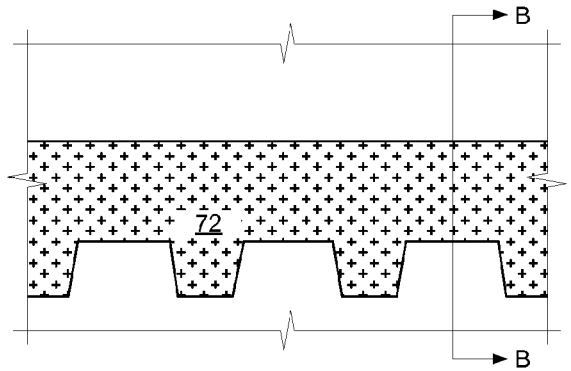
FIGS. 7A, 7B, 7C and 7D are diagrammatic sketches showing a stage in a process for making diode access devices such as are shown for example in FIGS. 2A, 2B, 2C.
Figure 7A:
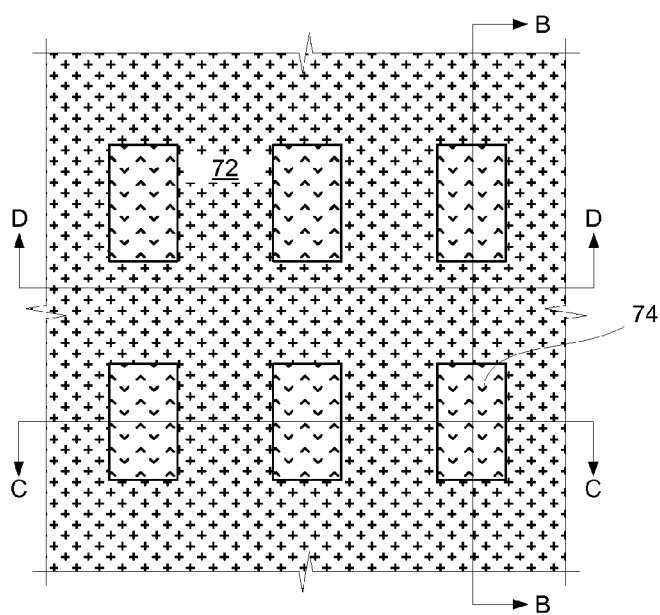
Figure 7B:
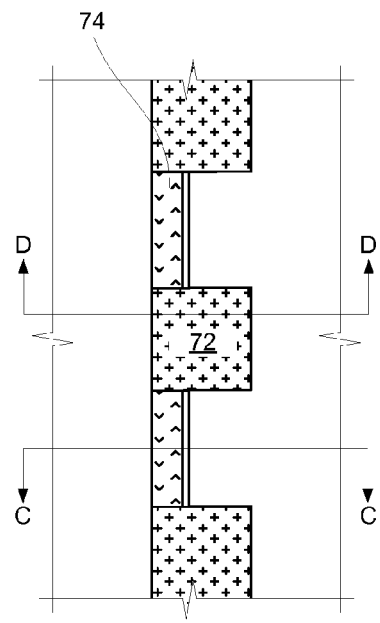
Figure 7C:
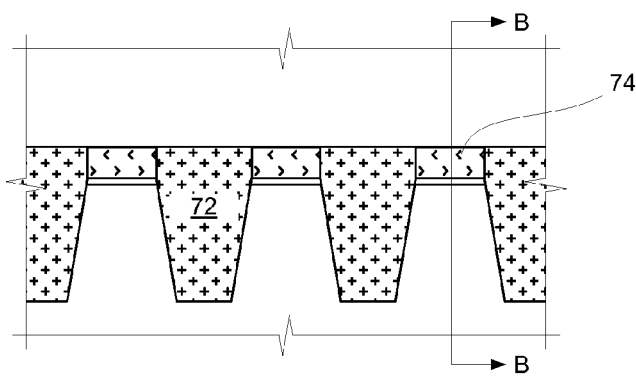
Figure 8D:
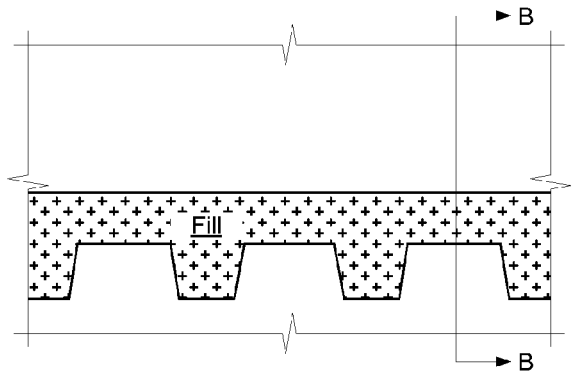
FIGS. 8A, 8B, 8C and 8D are diagrammatic sketches showing a stage in a process for making diode access devices such as are shown for example in FIGS. 2A, 2B, 2C.
Figure 8A:
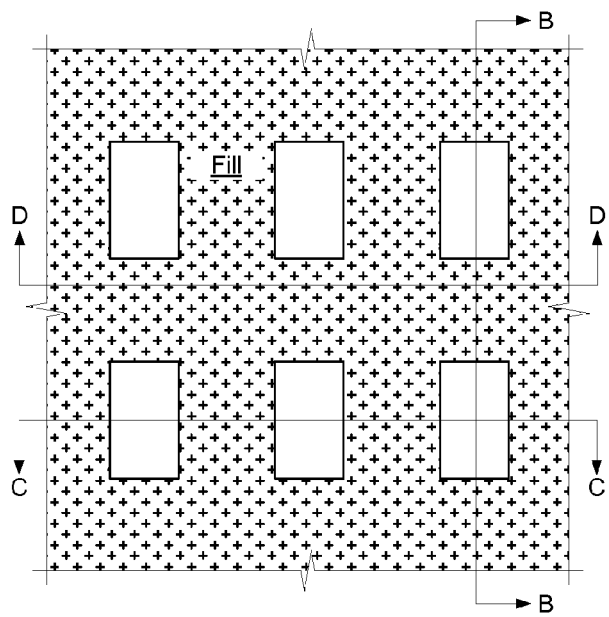
Figure 8B:
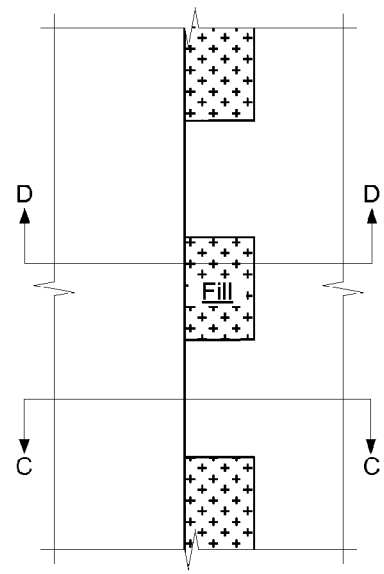
Figure 8C:
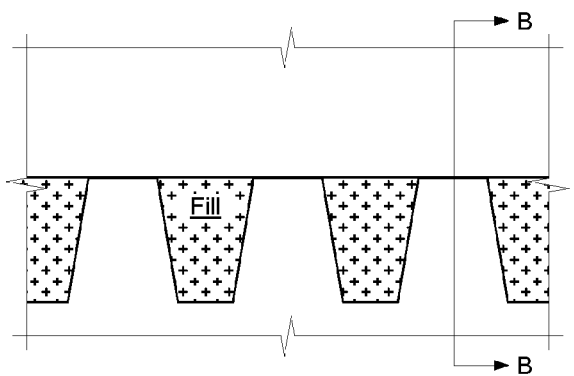
Figure 9D:
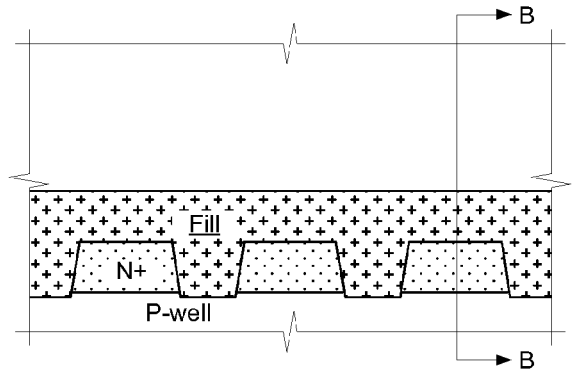
FIGS. 9A, 9B, 9C and 9D are diagrammatic sketches showing a stage in a process for making diode access devices such as are shown for example in FIGS. 2A, 2B, 2C.
Figure 9A:
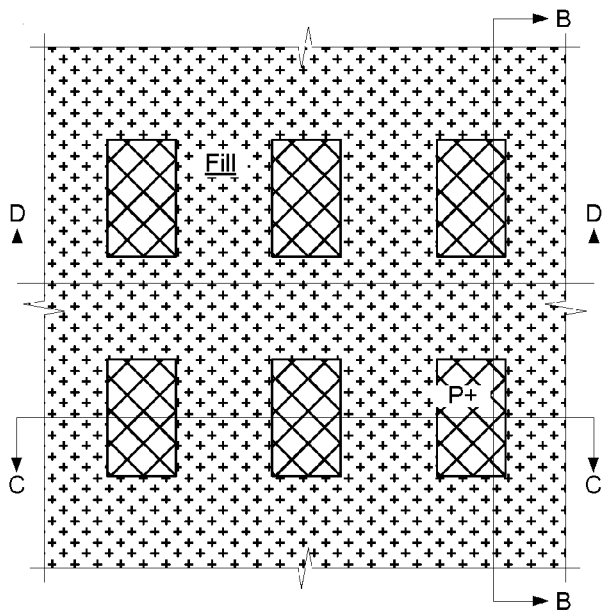
Figure 9B:
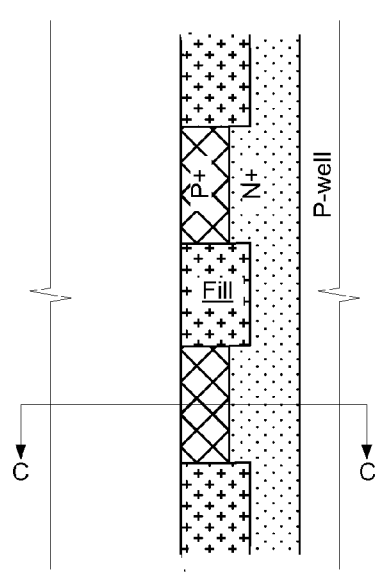
Figure 9C:
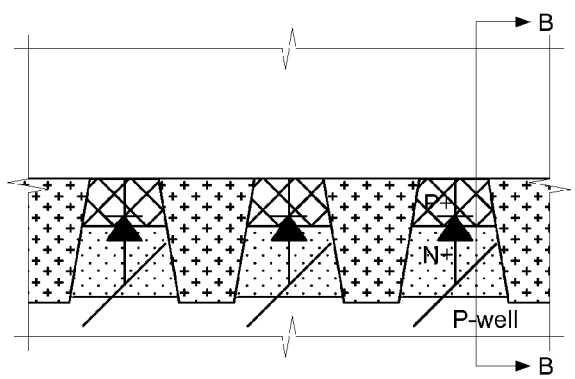

The a dielectric fill is deposited and planarized, for example by chemical mechanical polishing, to expose the hard mask material at the tops of the islands; a resulting structure showing planarized fill 72 and exposed hard mask 74 is shown in FIGS. 7A, 7B, 7C, 7C.

Thereafter the hard mask material is removed, for example by a wet etch (HF) and EG dip, as is the oxide (where present), with a result as shown in FIGS. 8A, 8B, 8C, 8D.

Thereafter implants are performed sequentially to form doped regions. Optionally, a deep implant of a first conductivity type (P– in the FIGS.) is performed to construct an isolation well (P-well in the FIGS.). A first (lower) implant of a second conductivity type (N+ in the FIGS.) is made to a depth less than the first depth (that is, less than the depth of the first trenches).

Because the depth of this implant is less than the depth of the first trenches, only a lower portion (at least) of the islands and an upper portion of the ridges are doped in this first implant; that is, the semiconductor base at the bottom (at least) of the first trenches between the ridges is left undoped. Thereafter a second implant of the first conductivity type (P+ in the FIGS.) is made to a depth less than the second depth (that is, less than the depth of the second trenches. Because the depth of this implant is less than the depth of the second trenches, only the islands are doped by this implant, and the resulting doped regions are separated by (and isolated by) the crenellations.

A resulting structure is shown in FIGS. 9A, 9B, 9C, 9D. The upper regions of the islands are doped (in this example) P+; and the lower regions of the islands and the upper regions of the ridges are doped (in this example) N+; and the lower regions of the ridges and the underlying substrate are lightly-doped P– to form a well (in this example, a P-well). Each P-N junction lies entirely within the island. As will be appreciated, in other embodiments the conductivity types may be reversed, so that the structure includes an N-well; a first doped region P+, and a second doped region N+.

It may be desirable to form a lightly-doped (or undoped, intrinsic) semiconductor region between the first (lower) implant and the second implant. The lightly-doped region may have a conductivity type P-- or N--.

As FIGS. 9A, 9B, 9C, 9D show, the top surfaces of the islands are exposed, and are available to make electrical contact with overlying structures, and particularly to make electrical contact with an overlying array of memory elements. In some examples the overlying memory elements are programmable resistance memory elements, and in particular examples the memory elements are phase change memory elements.

In the illustrated example the memory element 160 includes a phase change material. The memory element 160 may comprise, for example, one or more materials from the group of Ge, Sb, Te, Se, In, Ti, Ga, Bi, Sn, Cu, Pd, Pb, Ag, S, Si, O, P, As, N and Au.

Embodiments of the memory cells described herein include phase change based memory materials, including chalcogenide based materials and other materials, for the memory element. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistance memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, SrZrO3, $(BaSr)TiO_3$. Additional examples include materials for use in magnetoresistance random access memory (MRAM), for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, U.S. Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An example of a method for forming chalcogenide material uses PVD-sputtering or magnetron-sputtering method with source gas(es) of Ar, $N_2$, and/or He, etc. at a pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

Alternatively, the chalcogenide material may be formed by chemical vapor deposition (CVD).

Figure 11A:
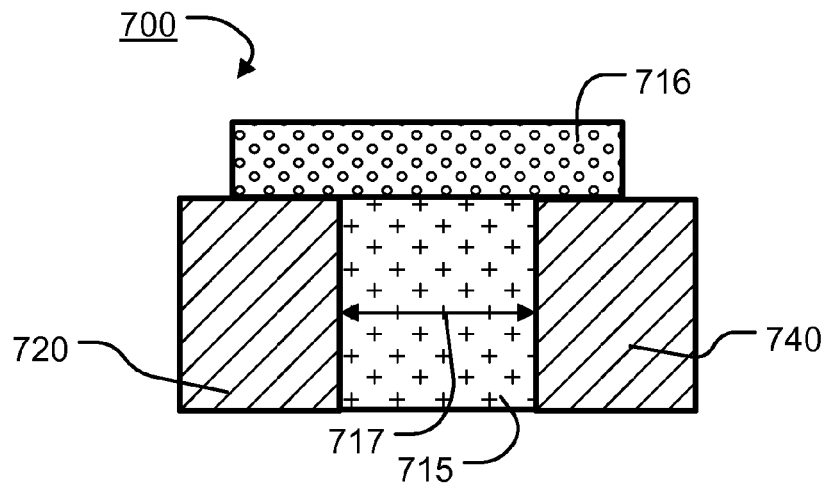
FIGS. 11A-11C illustrate alternative structures for programmable resistance memory cells, which can be utilized with the access devices described herein.
Figure 11B:
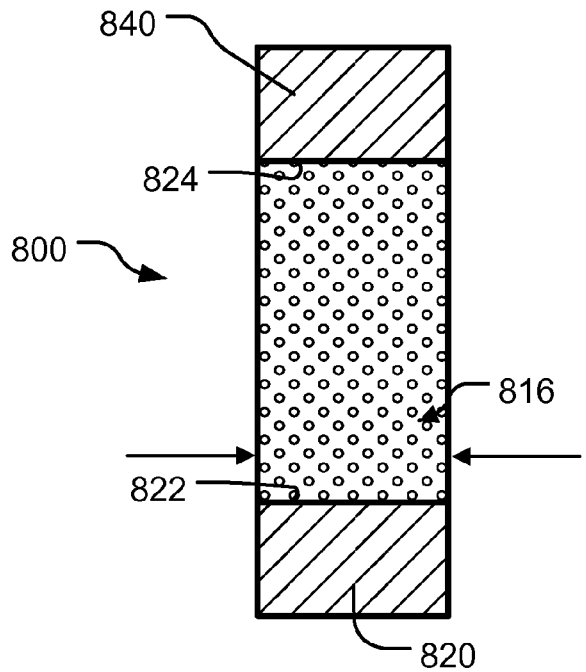
Figure 11C:
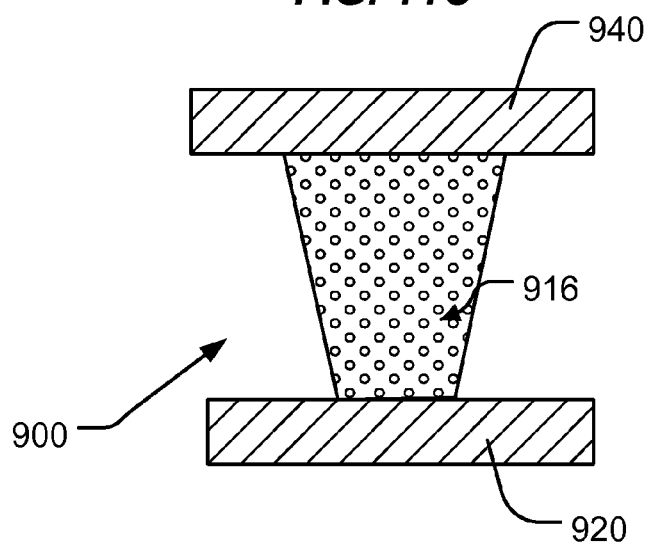

FIGS. 11A-11C illustrate alternative structures for programmable resistance memory cells, which can be utilized with the access devices described herein.

FIG. 11A illustrates a cross-sectional view of a memory cell 700 including a memory element 716 consisting of a body of phase change material. The memory cell 700 includes a dielectric spacer 715 separating first and second electrodes 720, 740. Memory element 716 extends across the dielectric spacer 715 to contact the first and second electrodes 720, 740, thereby defining an inter-electrode current path between the first and second electrodes 720, 740 having a path length defined by the width 717 of the dielectric spacer 715. In operation, as current passes between the first and second electrodes 720, 740 and through the memory element 716, the active region 710 heats up more quickly than the remainder (e.g. inactive region 713) of the memory element 716. The access device described herein can be coupled to one of the electrodes 720 and 740, for example.

FIG. 11B illustrates a cross-sectional view of a memory cell 800 including a memory element 816 consisting of a body of phase change material. The memory cell 800 includes a pillar-shaped memory element 816 contacting first and second electrodes 820, 840 at top and bottom surfaces 822, 824, respectively. The memory element 816 has a width 817 substantially the same as that of the first and second electrodes 820, 840 to define a multi-layer pillar surrounded by dielectric (not shown). As used herein, the term "substantially" is intended to accommodate manufacturing tolerances. In operation, as current passes between the first and second electrodes 820, 840 and through the memory element 816. The access device described herein can be coupled to the electrodes 820, for example.

FIG. 11C illustrates a cross-sectional view of a memory cell 900 including a memory element 916 consisting of a body of phase change material. The memory cell 900 includes a pore-type memory element 916 surrounded by dielectric (not shown) contacting first and second electrodes 920, 940 at top and bottom surfaces respectively. The memory element has a width less than that of the first and second electrodes, and in operation as current passes between the first and second electrodes and through the memory element the active region heats up more quickly than the remainder of the memory element. The access device described herein can be coupled to the electrodes 920, for example.

As will be understood, the programmable resistance material utilized can comprise phase change material, metal oxide material, and other memory materials as suits a particular implementation.

Other embodiments are within the following claims.

We claim:

1. A method for forming a memory cell access array, comprising:
   providing a single-crystalline semiconductor body having a first conductivity type;
   forming a layer of a hard mask material over the semiconductor body;
   forming first trenches in a first direction to a first depth in the semiconductor body, resulting in ridges surmounted by a patterned hard mask;
   depositing an antireflective coating material to fill the first trenches and to form a thin layer of antireflective coating material over the patterned hard mask;
   forming second isolation trenches in a direction orthogonal to the first direction to a second depth less than the first depth, resulting in crenellations in the ridges isolating single-crystalline semiconductor islands surmounted by hard mask material;
   filling the first and second trenches with a dielectric fill and planarizing to expose the hard mask material;
   removing the hard mask material;
   performing a first implant of a second conductivity type to a depth less than the first depth; and
   performing a second implant of the first conductivity type to a depth less than the depth of the first implant.

2. The method of claim 1, further comprising forming an oxide layer over the single-crystalline semiconductor body prior to forming the hard mask layer.

3. The method of claim 1 wherein the hard mask layer comprises silicon nitride.

4. The method of claim 1 wherein the second trenches are formed to a depth in a range about 50 nm to about 250 nm less than the depth of the first trenches.

5. The method of claim 4 wherein the second trenches are formed to a depth in a range about 100 nm to about 200 nm less than the depth of the first trenches.

6. The method of claim 5 wherein the second trenches are formed to a depth about 150 nm less than the depth of the first trenches.

7. The method of claim 1, further comprising performing a deep implant having a conductivity type opposite the first conductivity type, to form a well isolating the first and second implants.

8. The method of claim 7 wherein the deep implant has a conductivity type N− to form an N-well, the first implant has a conductivity type P+, and the second implant has a conductivity type N+.

9. The method of claim 7 wherein the deep implant has a conductivity type P− to form a P-well, the first implant has a conductivity type N+, and the second implant has a conductivity type P+.

10. The method of claim 1, further comprising forming a lightly-doped region between the region doped by the first implant and the region doped by the second implant.

11. The method of claim 10 wherein the lightly-doped region has a conductivity type P−−.

12. The method of claim 10 wherein the lightly-doped region has a conductivity type N−−.

13. The method of claim 1, further comprising forming an array of memory elements electrically connected with the access devices.

14. A method for forming a memory cell access array, comprising:
    providing a single-crystalline semiconductor body having a first conductivity type;
    forming first trenches in a first direction to a first depth in the semiconductor body,
    forming second isolation trenches in a direction orthogonal to the first direction to a second depth less than the first depth;
    filling a dielectric material in the first and second trenches;
    performing a first implant of a second conductivity type to a depth less than the first depth; and
    performing a second implant of the first conductivity type to a depth less than the depth of the first implant.

15. The method of claim 14, further comprising depositing a layer of antireflective coating material to fill the first trenches.

16. The method of claim 15, wherein some antireflective coating material remains at the bottom of the first trenches after forming the second trenches.

17. The method of claim 14, further comprising forming a lightly-doped region between the region doped by the first implant and the region doped by the second implant.

18. The method of claim 14 wherein the lightly-doped region has a conductivity type P−−.

19. The method of claim 14 wherein the lightly-doped region has a conductivity type N−−.

20. The method of claim 14, further comprising forming an array of memory elements electrically connected with the access devices.

21. A memory access device array comprising an array of islands defined between crenellations in a plurality of ridges formed of a single crystalline semiconductor body, the ridges being separated by trenches having a first depth, the crenellations having a second depth less than the first depth, wherein first (lower) conductively-doped semiconductor regions having a first conductivity type occupy lower portions of the islands and upper portions of the ridges between the islands, and wherein second (upper) conductively-doped semiconductor regions having a second conductivity type occupy upper portions of the islands, and wherein p-n junctions are defined within the islands between the first and second doped regions.

22. The memory access device array of claim 21, further comprising a deep doped region of the second conductivity type constituting a well under the first conductively-doped semiconductor region.

23. The memory cell access device array of claim 22, further comprising an array of memory elements electrically connected with the access devices.

24. The memory cell of claim 23 wherein the memory elements comprise programmable resistance memory elements.

25. The memory cell of claim 23 wherein the memory elements comprise phase change memory elements.

* * * * *